United States Patent [19]

Nonaka et al.

[11] Patent Number: 5,201,994
[45] Date of Patent: Apr. 13, 1993

[54] DRY ETCHING METHOD

[75] Inventors: Mikio Nonaka; Hiroyuki Hara, both of Zama, Japan

[73] Assignee: Kabushiki Kaisha Tokuda Seisakusho, Kanagawa, Japan

[21] Appl. No.: 536,568

[22] PCT Filed: Nov. 17, 1989

[86] PCT No.: PCT/JP89/01174
§ 371 Date: Jul. 17, 1990
§ 102(e) Date: Jul. 17, 1990

[87] PCT Pub. No.: WO90/05994
PCT Pub. Date: May 31, 1990

[30] Foreign Application Priority Data

Nov. 18, 1988 [JP] Japan .................................. 63-291736
Jan. 9, 1989 [JP] Japan .................................. 1-2461
May 29, 1989 [JP] Japan .................................. 1-135189

[51] Int. Cl.$^5$ .......................... B44C 1/22; C03C 15/00; C03C 25/06
[52] U.S. Cl. ............................ 156/643; 156/657; 156/659.1; 156/345; 252/79.1
[58] Field of Search ............. 156/643, 646, 653, 657, 156/659.1, 662, 345; 252/79.1; 204/192.37

[56] References Cited

U.S. PATENT DOCUMENTS

| 4,462,863 | 7/1984 | Nishimatsu et al. | 156/643 |
| 4,529,476 | 7/1985 | Kawamoto et al. | 156/643 |
| 4,568,410 | 2/1986 | Thornquist | 156/643 |
| 4,613,401 | 9/1986 | Hoshino | 252/279.1 |
| 4,857,140 | 8/1989 | Loewenstein | 156/643 |

Primary Examiner—William A. Powell
Attorney, Agent, or Firm—Koda and Androlia

[57] ABSTRACT

The present invention relates to a dry etching method in which the type of reactive gas used is improved and the selectively between a workpiece being etched and a substance below the workpiece is increased. A gas comprising a fluoride gas and a compound gas containing hydrogen as a constituent element is used as the reactive gas. According to the present invention, the etching selectivity between a workpiece being etched and a substance below the workpiece is greatly increased, and etching of the substance below the workpiece can be prevented.

The present invention is applicable to a semiconductor structure having a silicon oxide film below a silicon nitride film.

5 Claims, 5 Drawing Sheets

DRY ETCHING METHOD

The present invention relates to a dry etching method and, in particular, to a dry etching method in which the type of reactive gas used is improved and the selectivity between a workpiece being etched and a substance below the workpiece is increased.

BACKGROUND OF THE INVENTION

Description of the Prior Art

In the process of manufacturing ICs, the technique is known of superimposing various different films on top of a substrate of a substance such as silicon, then, using a plasma of a gas such as carbon tetrafluoride, perform dry etching to selectively remove parts of those films. Many different dry etching methods have been developed for this purpose, but the isotropy and high levels of selectivity of chemical dry etching methods make them widely used. In each of these chemical dry etching methods, a reactive gas is excited by microwaves in a plasma generation device to create an activated material, then this activated material is sent to a reaction chamber separated from the plasma chamber to react with, and hence etch, a workpiece within the reaction chamber, so the choice of reactive gas used for the etching is an important keypoint of such methods.

It is conventional practice to a use a mixture of carbon tetra-flouoride ($CF_4$), oxygen ($O_2$),k and nitrogen ($N_2$) as this reactive gas.

However, this conventional technique of using a gas mixture of carbon tetrafluoride, oxygen, and nitrogen as the reactive gas causes a problem when the workpiece to be etched is a silicon nitride film, in that is difficult to selectively etch the silicon nitride film and not a silicon oxide film thereunder.

The present invention solves the above problem of the prior art, and it provides a dry etching method in which the selectively between a workpiece being etched and a substance below the workpiece is increased.

SUMMARY OF THE INVENTION

In order to achieve the above object, the dry etching method of the present invention is an etching method in which a work-piece to be etched is placed on a platen in a vacuum vessel, and a reactive gas activated by an activation means is used to etch the workpiece, wherein a gas mixture of a fluoride gas and a compound gas containing hydrogen as a constituent element is used as the reactive gas.

As the above fluoride gas, it is preferable to use one of $CF_4$, $NF_3$, or $SF_6$. As the compound gas containing hydrogen as a constituent element, one of vaporized ethanol, methanol, or water, or even hydrogen itself, can be used.

According to the present invention, a gas mixture of a fluoride gas, oxygen, and a compound gas containing hydrogen as a constituent element can also be used as the reactive gas.

As described above, the present invention provides a dry etching method in which the use of a reactive gas comprising a mixture of a fluoride gas and a compound gas containing hydrogen as a constituent component greatly increases etching selectivity between a workpiece to be etched and a substance below the workpiece, enabling prevention of etching of the substance below the workpiece.

DESCRIPTION OF THE PREFERRED EMBODIMENTS

An embodiment of the dry etching method of the present invention is described below with reference to the figures.

Figure 1:
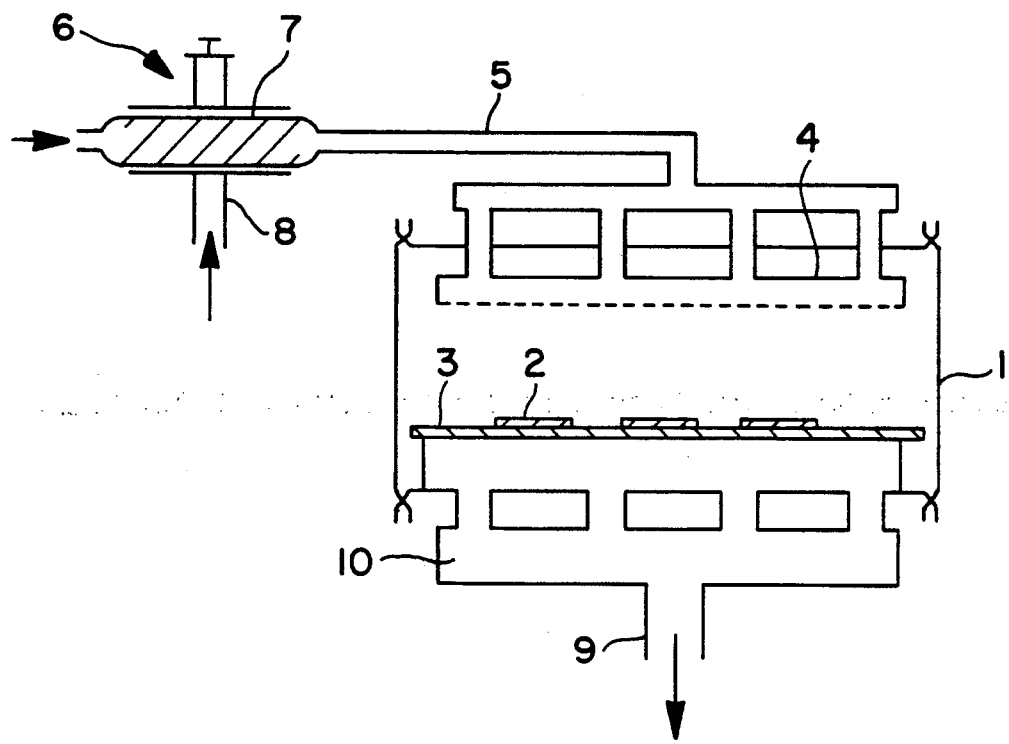
FIG. 1 is a schematic diagram of a dry etching device to which the dry etching method of the present invention can be applied.

FIG. 1 shows an example of a dry etching device to which the dry etching method of the present invention can be applied.

In FIG. 1, reference number 1 denotes a vacuum vessel, and a platen 3 to support a workpiece to be etched 2 is provided within an etching chamber of the vacuum vessel 1. In an upper portion of the vacuum vessel 1 is provided a gas distribution tube 4 which opens above the workpiece to be etched 2, and this gas distribution tube 4 is connected to a gas introduction tube 5. A plasma generation device 6 is provided partway along the gas introduction tube 5, the plasma generation device 6 comprising a discharge tube 7 made of quartz with a wave guide 8 positioned at the outer side thereof, and generating a plasma therein by the application of microwaves. An exhaust tube 9 for removing reactive gases is connected via a manifold 10 to the opposite end of the vacuum vessel 1, on a lower wall therefore, and this exhaust tube 9 is connected to a vacuum pump that is not shown in the figure.

According to the present invention, a mixture of gases comprising a fluoride gas and a compound gas containing hydrogen as a constituent element is used as the reactive gas in the etching device constructed in the above manner. Any of $CF_4$, $NF_3$, or $SF_6$ is suitable as the gas containing fluorine. In addition, any of vaporized ethanol, methanol, or water can be used as the compound gas containing hydrogen as a constituent element, or even hydrogen itself. This gas mixture flows from the gas introduction tube 5, and a reactive gas is excited within the discharge tube 7 made of quartz by microwaves applied from the wave guide 8, to form a plasma.

Figure 2:
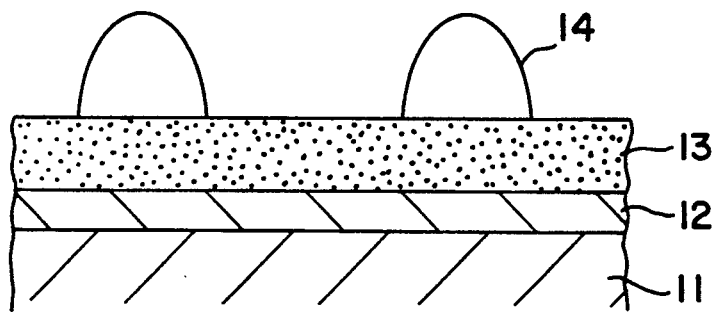
FIG. 2 is an enlarged cross-section through a workpiece.

An example of etching the workpiece to be etched 2 using the above dry etching method will now be described with reference to FIG. 2. In the figure, a silicon oxide film 12 on the order of 1000 Ångstrom units thick is formed on a silicon substrate 11 by a thermal oxidation method, a silicon nitride film 13 of approximately 2000Ångstrom units thick is then formed on the silicon oxide film 12 by a CVD method, then a pattern of photoresist 14 is formed on the silicon nitride film 13 by photolithography.

A mixture of gases comprising 300 sccm of carbon tetrafluoride ($CF_4$) and 200 sccm of oxygen ($O_2$), to which was added a certain amount of ethyl alcohol, was used as the reactive gas sent into the vacuum vessel 1. This reactive gas etched the workpiece to be etched 2 under conditions of microwave energy of 700 W and a pressure of 50 Pa.

Figure 3:
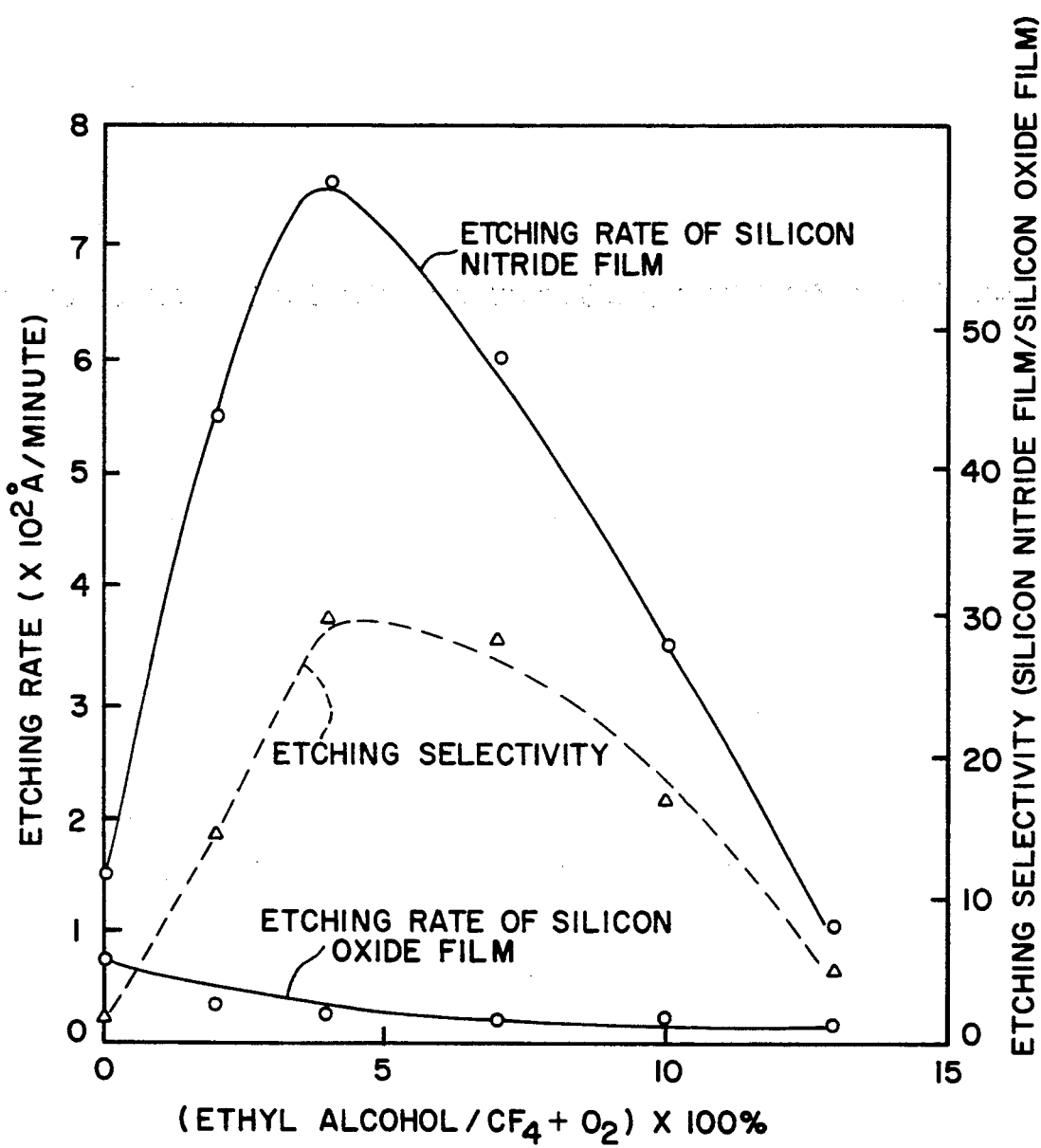
FIGS. 3 and 4 are graphs of etching selectivity against etching speed and mixing ratios of etching gases containing ethyl alcohol.

The amount of ethyl alcohol added as described above was varied, and relationships with respect to the additional amount of ethyl alcohol {expressed as the ratio (ethyl alcohol)/$CF_4+O_2$)} of the selectivity with which the silicon nitride film 13 and the silicon oxide film 12 were etched and the speeds at which the silicon nitride film 13 and the silicon oxide film 12 were etched were as shown in FIG. 3.

As is clear from this figure, when the additional amount of ethyl alcohol was on the order of 4%, the etching selectivity was on the order of 30; a dramatically improved etching selectivity over the case in which no ethyl alcohol was added. This is considered to be due to an increase in the etching rate of the silicon nitride film 13 and a decrease in the etching speed of the silicon oxide film 12.

Note that, if the additional amount of ethyl alcohol exceeds about 4%, the etching rate of the silicon nitride film 13 decreases and the etching selectivity also decreases, but, so long as the additional amount of ethyl alcohol is selected from with the range of about 2% to 11%, an etching selectivity of 15 or higher can be maintained.

As described above, the result of using a gas to which ethyl alcohol has been added as the gas mixture of the present invention enables a huge increase in etching selectivity.

Figure 4:
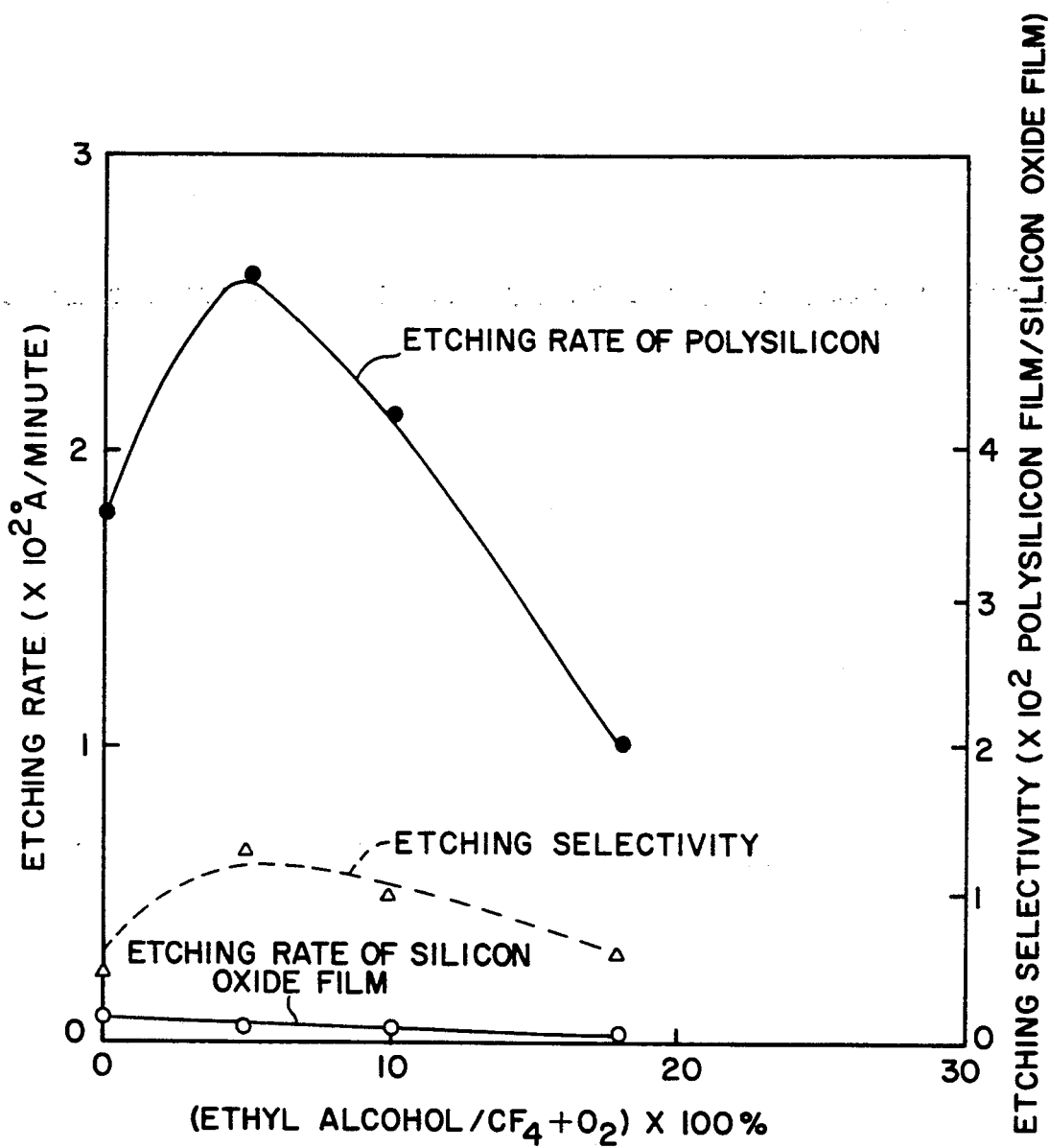

FIG. 4 is a graph of the etching speeds of polysilicon and silicon oxide film, and the etching selectivity of these substances, when a gas to which ethyl alcohol has been added was used as the reactive gas, showing that, in this case as well, the addition of preferably between 2% and 11% of ethyl alcohol enables an increase in etching selectivity to 90 or higher.

The above examples described cases in which a gas with additional ethyl alcohol was used as the gas mixture, but the present invention is not limited to this case; for example, the same effect can be achieved by using a gas of any substance that includes a hydroxyl group, such as methyl alcohol.

Figure 5:
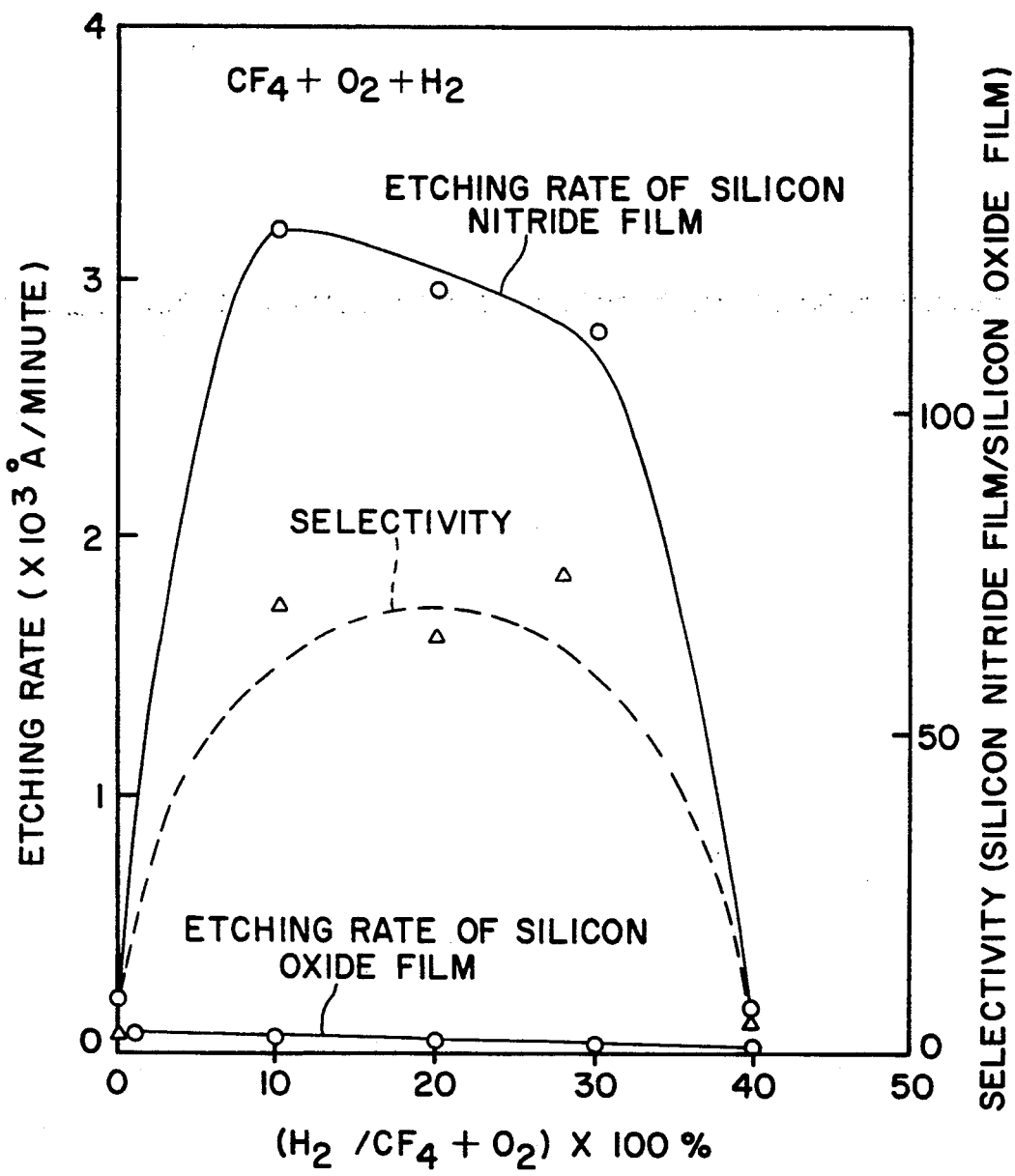
FIG. 5 is a graph of etching selectivity against etching speed and mixing ratios of etching gases containing hydrogen.

Next, an example of using a reactive gas in which a certain quantity of hydrogen ($H_2$) is mixed with carbon tetrafluoride ($CF_4$) and oxygen ($O_2$) will be described with reference to FIG. 5. In this example, the composition ratio of $H_2$ with respect to 300 sccm of carbon tetrafluoride ($CF_4$) and 200 sccm of oxygen ($O_2$) was varied, and a workpiece to be etched 2 was etched in a vacuum vessel 1 under conditions of microwave energy of 700 W and a pressure of 50 Pa. In this case, measured results of the etching rate of a silicon nitride film 13 and a silicon oxide film 12 with respect to the composition ratio of $H_2\{H_2/(CF_4+O_2)\}$ and the selectivity of the silicon nitride film over the silicon oxide film are shown in FIG. 5. As is clear from this figure, when the composition ratio of $H_2$ is 10%, the etching speed of silicon nitride film is at a maximum; and when the composition ratio of $H_2$ is 20%, the selectivity of silicon nitride film over silicon oxide film is at a maximum.

Figure 6:
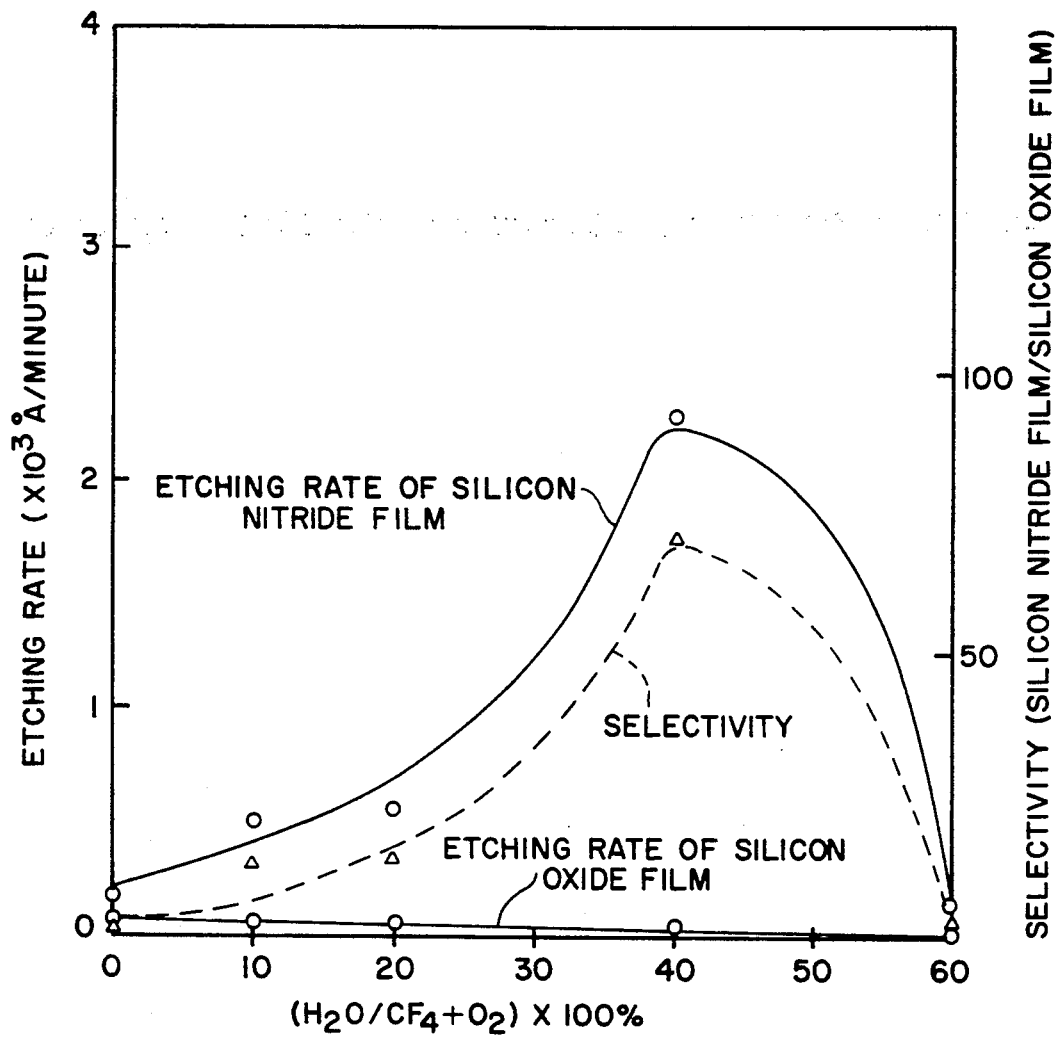
FIG. 6 is a graph of etching selectivity against etching speed and mixing ratios of etching gases containing water.

In addition, an example of using a vaporized $H_2O$ in the reactive gas will now be described with reference to FIG. 6. As is clear from this figure, when the composition ratio of $H_2O$ is 40%, the etching speed of silicon nitride film is at a maximum and, in the same way, the selectivity of silicon nitride film over silicon oxide film is at a maximum.

The above-described embodiments of the present invention used chemical dry etching with a separated type of discharge chamber as the means of activating a gas, but the present invention is not limited thereto; it can also be applied to a barrel type of plasma etching device using high-frequency excitation, or to a parallel-plate type of plasma generating device or an electronic cyclotron resonance type of plasma generating device.

Applicability of the Present Invention

The dry etching method of the present invention is applicable to the dry etching of a semiconductor device having a silicon oxide film under a silicon nitride film.

We claim:

1. A method of dry etching comprising the steps of: introducing reacting gas into a vacuum chamber, said reacting gas being a mixture of fluoride gas, oxygen and alcohol; applying a microwave electric field to generate a plasma; and injecting activated particles in said plasma to a workpiece to be etched in said vacuum chamber.

2. A method of dry etching as set forth in claim 1, wherein said alcohol is ethylalcohol.

3. A method of dry etching as set forth in claim 1, wherein said alcohol is methylalcohol.

4. A method of dry etching as set forth in claim 1, wherein said fluoride gas is $CF_4$.

5. A method of dry etching as set forth in claim 2, wherein an additional amount of the ethylalcohol is selected from with the range of about 2% to 11%.

* * * * *